(12) United States Patent
Pao et al.

(10) Patent No.: US 9,620,509 B1
(45) Date of Patent: Apr. 11, 2017

(54) STATIC RANDOM ACCESS MEMORY DEVICE WITH VERTICAL FET DEVICES

(71) Applicant: TAIWAN SEMICONDUCTOR MANUFACTURING CO., LTD., Hsinchu (TW)

(72) Inventors: Chia-Hao Pao, Hsinchu (TW); Chang-Ta Yang, Hsinchu (TW); Feng-Ming Chang, Zhubei (TW); Ping-Wei Wang, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/928,685

(22) Filed: Oct. 30, 2015

(51) Int. Cl.
*H01L 27/11* (2006.01)
*H01L 27/02* (2006.01)

(52) U.S. Cl.
CPC ...... *H01L 27/1104* (2013.01); *H01L 27/0207* (2013.01)

(58) Field of Classification Search
CPC .................. H01L 27/1104; H01L 27/0207
See application file for complete search history.

(56) References Cited

U.S. PATENT DOCUMENTS

| | | | | |
|---|---|---|---|---|
| 8,809,145 B2* | 8/2014 | Tang | ........................ | H01L 29/78 257/E21.091 |
| 8,847,298 B2* | 9/2014 | Thomas | .............. | H01L 21/3065 257/306 |
| 2004/0240277 A1* | 12/2004 | Hanzawa | ............. | G11C 15/043 365/189.07 |
| 2006/0220108 A1* | 10/2006 | Hashimoto | ....... | H01L 21/28273 257/330 |
| 2006/0243956 A1* | 11/2006 | Rinerson | ............. | G11C 11/5685 257/1 |
| 2007/0189057 A1* | 8/2007 | Cheng | ...................... | G11C 8/16 365/149 |
| 2009/0315090 A1* | 12/2009 | Weis | ................. | H01L 21/76224 257/296 |
| 2015/0370951 A1* | 12/2015 | Kawa | .................. | G06F 17/5072 716/119 |
| 2016/0027499 A1* | 1/2016 | Liaw | ...................... | G11C 11/412 365/154 |
| 2016/0335387 A1* | 11/2016 | Moroz | ................ | G06F 17/5077 |

* cited by examiner

*Primary Examiner* — Ida M Soward
(74) *Attorney, Agent, or Firm* — McDermott Will & Emery LLP

(57) ABSTRACT

An SRAM includes an SRAM array including a plurality of SRAM cells arranged in a matrix. Each of the SRAM cells includes six vertical field effect transistors. The SRAM array includes a plurality of groups of conductive regions extending in the column direction. Each of the plurality of groups of conductive regions includes a first to a fourth conductive region arranged in this order in the row direction, and the first to fourth conductive regions are separated by insulating regions from each other. The first, second and third conductive regions are coupled to sources of first conductive type VFETs, and the fourth conductive region is coupled to sources of second conductive type VFETs. The plurality of groups are arranged in the row direction such that the fourth conductive region of one group of conductive regions is adjacent to the first conductive region of adjacent one group of conductive regions.

20 Claims, 7 Drawing Sheets

STATIC RANDOM ACCESS MEMORY DEVICE WITH VERTICAL FET DEVICES

TECHNICAL FIELD

The disclosure relates to a semiconductor device, and more particularly to an SRAM (Static Random Access Memory) device having vertical FET (VFET) devices.

BACKGROUND

As the semiconductor industry has progressed into nanometer technology process nodes in pursuit of higher device density, higher performance, lower power consumption and lower costs, challenges from both fabrication and design issues have resulted in the development of three-dimensional designs, such as a fin field effect transistor (Fin FET). In a Fin FET device, it is possible to utilize additional sidewalls and to suppress a short channel effect.

Another candidate is a vertical field effect transistor (VFET) device. While a Fin FET device has a channel extending in a horizontal direction as a fin, in a VFET, a channel extends in a vertical direction (normal direction to a substrate surface). When a VFET is a gate all around (GAA) device, all of the channel layer (surfaces of the channel layer) can be subject to gate control. A GAA device, such as a GAA MOSFET (or MISFET) device, includes a very narrow cylindrical channel body. In particular, a vertical type GAA device (VGAA) having a channel extending in a vertical direction is a promising device for a candidate for low power SRAM applications. In the present disclosure, new layout structures and configurations of an SRAM using a VFET device with a more uniform layout structure are provided.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Further, the layout structures shown in the present disclosure are design layouts and do not necessarily show exact physical structures fabricated as a semiconductor device.

Figure 1A:
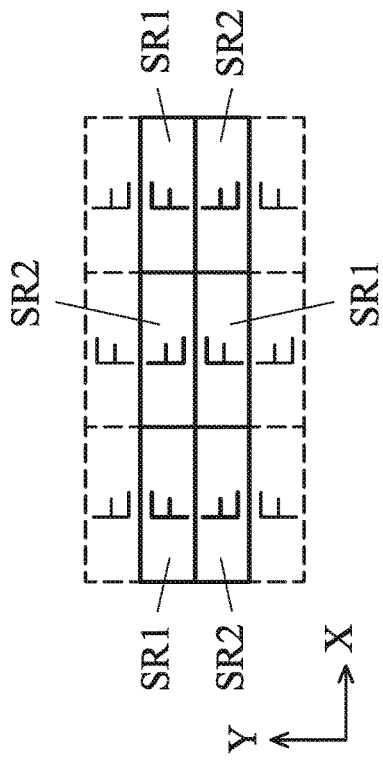
FIG. 1A is an exemplary circuit diagram of an SRAM unit cell.

FIG. 1A is an exemplary circuit diagram of an SRAM cell. FIG. 1A shows an SRAM cell, and a plurality of SRAM cells form SRAM arrays in which a plurality of SRAM cells are arranged in a matrix along a row direction and a column direction in an SRAM device.

An SRAM cell includes two cross-coupled inverters INV1 and INV2 having a data storage node DP1 and a complementary data storage node DP2. The output of the first inverter INV1 is coupled to the input of the second inverter INV2, and the output of the second inverter INV2 is coupled to the input of the first inverter INV1. The SRAM cell further includes a first pass-gate FET device PG1 coupled to the output of the first inverter INV1 and the input of the second inverter INV2 and a second pass-gate FET device PG2 coupled to the output of the second inverter INV2 and the input of the first inverter INV1. Gates of the first and second pass-gate FET devices are coupled to a word line WL, a source/drain of the first pass-gate FET device PG1 is coupled to a first bit line BL, and a source/drain of the second pass-gate FET device PG1 is coupled to a second bit line BLB, which is the complement of the first bit line BL. In the present disclosure, a source and a drain of an FET device may be interchangeably used.

Figure 1B:
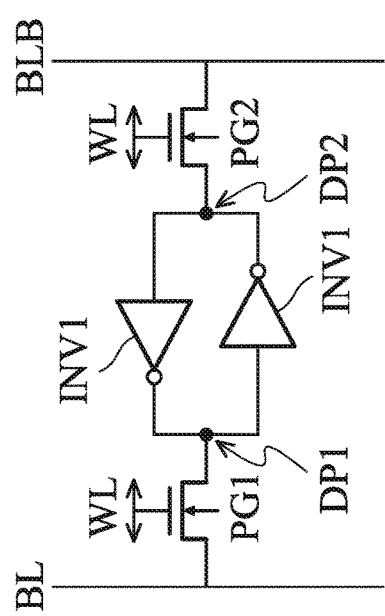
FIG. 1B is an exemplary circuit diagram of an SRAM unit cell.

As shown in FIG. 1B, the first inverter INV1 includes a first first-conductive-type FET device PU1 and a first second-conductive-type FET device PD1. The second inverter INV2 includes a second first-conductive-type FET device PU2 and a second second-conductive-type FET device PD2. The first pass-gate device PG1 and the second pass-gate device PG2 are second-conductive type devices. In this embodiment, the first conductive type is a P-type and the second conductive type is an N-type. Of course, it is possible in another embodiment that the first conductive type is an N-type and the second conductive type is a P-type, and in such a case the remaining elements in the SRAM are appropriately modified according to the common knowledge in the art.

The SRAM further includes a first P-type well PW1, a second P-type well PW2 and an N-type well NW. As shown in FIG. 1B, the first pass-gate device PG1 (N-type), the first N-type FET device PD1 and the second N-type FET device PD2 are disposed within the first P-type well PW1, the second pass-gate FET device PG2 (N-type) is disposed within the second P-type well PW2, and the first P-type FET device PU1 and the second P-type FET device PU2 are disposed within the N-type well NW. When a plurality of SRAM cells are arranged in a matrix, the first P-type well PW1 and the second P-type well PW2 are merged as a P-type well PW (see, FIG. 4).

The first pass-gate device PG1, the second pass-gate device PG2, the first P-type device PU1, the first N-type device PD1, the second P-type device PU2 and the second N-type device PD2 each are vertical FET (VFET) devices. The vertical FET devices are one or more of a VGAA FET, and a vertical nanowire FET. The VGAA device may be one or more of a single nanowire VGAA, a multiple nanowire VGAA, or a nano-bar type VGAA. In this embodiment, a VGAA device is employed, and the structure of a VGAA device will be described later.

Figure 1C:
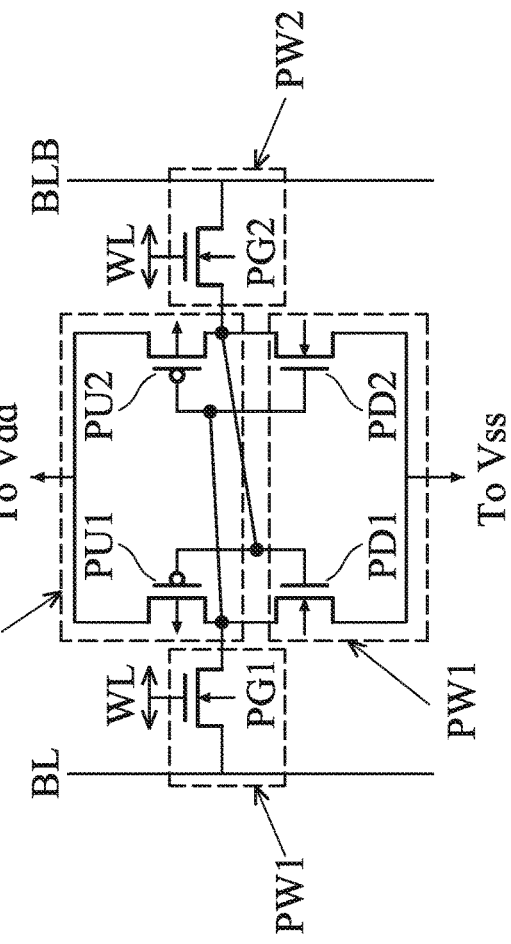
FIG. 1C is an exemplary layout of four SRAM unit cells according to one embodiment of the present disclosure.

The SRAM includes a plurality of SRAM cells. FIG. 1C shows an exemplary layout of four SRAM cells according to one embodiment of the present disclosure. The plurality of SRAM cells include a first and a second SRAM cells, SR1 and SR2. The first SRAM SR1 has the layout structure of FIG. 3. The second SRAM SR2 has a layout which is a flipped layout of the first SRAM SR1 with respect to an axis parallel to the X direction (row direction). In the SRAM device or an SRAM array, a plurality of the first SRAM cells and a plurality of second SRAM cells are alternately arranged in the row direction and the column direction (Y direction), thereby forming a checker board pattern matrix, as shown in FIG. 1C.

Figure 2:
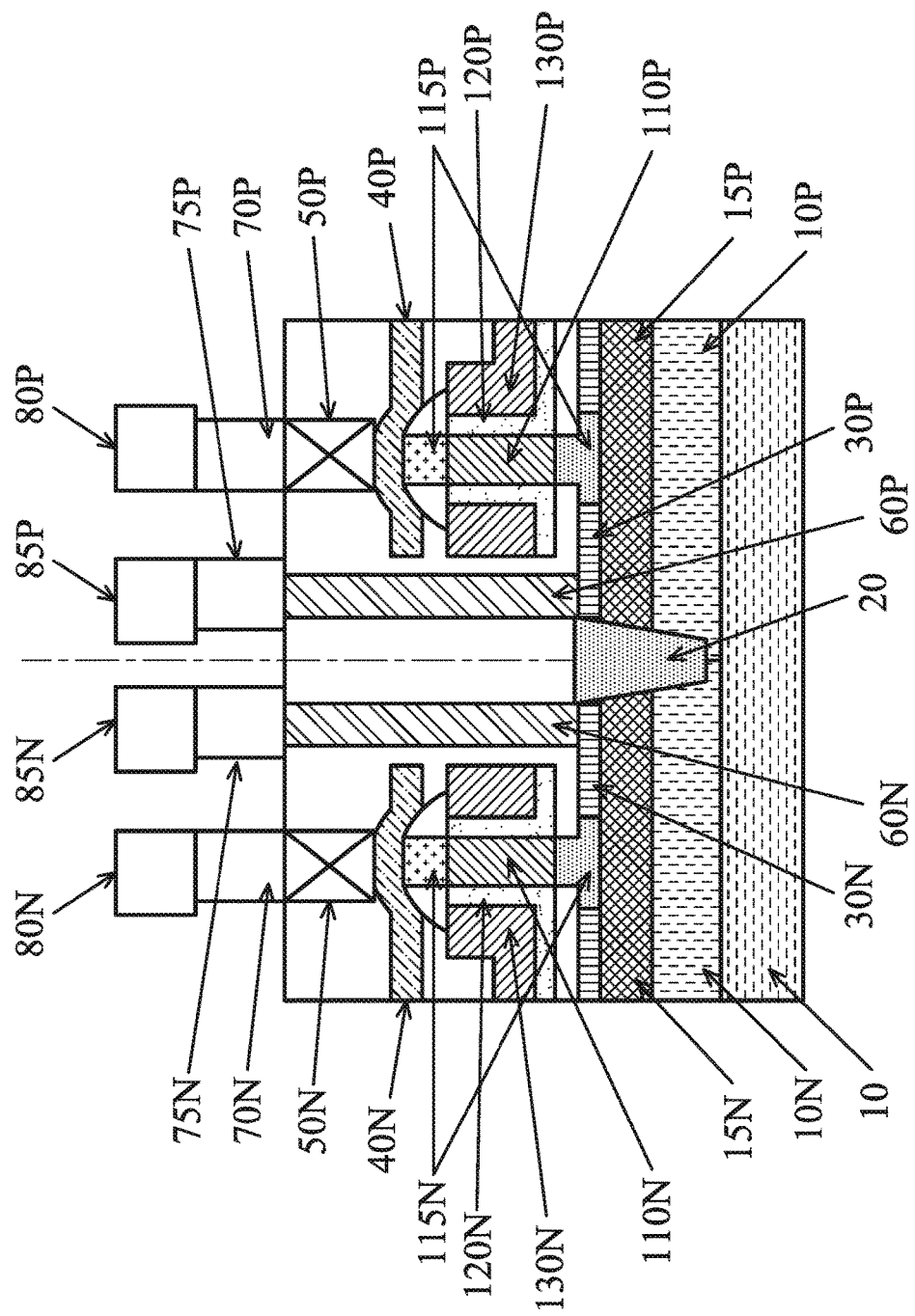
FIG. 2 is an exemplary cross sectional view of a VGAA device.

FIG. 2 is an exemplary cross sectional view of a VGAA device. The exemplary structures and manufacturing processes for VGAA FET devices can be found in, for example, U.S. Patent Publication Nos. 2014/0332859, 2015/0171032 and 2015/0228759, the entire contents of each of which are incorporated herein by reference.

The VGAA device includes a substrate 10 made of, for example, Si. A p-type well 10N and an n-type well 10B are formed in the substrate 10. An n-type active region 15N and a p-type active region 15P are formed in the p-type well 10N and the n-type well 10B, respectively. The n-type device region including the p-type well 10N and the n-type active region 15N are separated by a shallow trench isolation (STI) 20 from the p-type device region including the n-type well 10B and the p-type active region 15P. On the upper surface of the active region regions 15N and 15P, silicide layers 30N and 30P are formed, respectively, in some embodiments. The silicide layer 30N, the active region 15N or the combination thereof may be referred to as an n-type conductive region. Similarly, the silicide layer 30P, the active region 15P or the combination thereof may be referred to as a p-type conductive region The n-type active region 15N for the n-type VGAA device may include an epitaxially-grown material. The epitaxially-grown material may be one or more layers of SiP, SiC, SiCP, Si, Ge, or a III-V material, or any other suitable materials. The p-type active region 15P for the p-type VGAA device may include an epitaxially-grown material. The epitaxially-grown material may be one or more layers of Si, SiGe, Ge, SiP, SiC or a III-V material, or any other suitable materials.

The VGAA device includes a channel layer extending in the vertical direction (the normal direction to the substrate) and the carriers (electrons or holes) travel along the vertical direction. The shape of the channel layer may be a wire in nano-meter scale having a substantially uniform diameter, or a bar-shape in nano-meter scale having a substantially rectangular cross section in a place parallel to the substrate. The diameter of the nano-wire is in a range of about 5 nm to about 50 nm in some embodiments, or is in a range of about 10 nm to about 30 nm in other embodiments. The number of nano-wires in one VGAA FET is one or more. The longer side of the nano-bar is in a range of about 10 nm to about 60 nm in some embodiments, or is in a range of about 20 nm to about 40 nm in other embodiments, and the shorter side is in a range of about 5 nm to about 50 nm in some embodiments, or is in a range of about 10 nm to about 30 nm in other embodiments.

The material for the nano-wire and the nano-bar is Si, Ge, SiGe, SiC, SiP, SiCP, or SiGeB, or a Group III-V material, or any other suitable materials, with appropriate dopants. The Group III-V material may be one or more of InP, InAs, GaAs, AlInAs, InGaP, InGaAs, GaAsSb, GaPN and AlPN, or any other suitable materials.

The dopant in the channel layer for an n-type VGAA FET is one or more of B, In, Ge, N and C, or any other suitable elements, the doping dose amount is in a range of about $1 \times 10^{12}$ cm$^{-3}$ to about $5 \times 10^{13}$ cm$^{-3}$. The dopant in the channel layer for a p-type VGAA FET is one or more of P, As, Sb, Ge, N and C, or any other suitable elements, and the doping dose amount is in a range of about $1 \times 10^{12}$ cm$^{-3}$ to about $5 \times 10^{13}$ cm$^{-3}$.

When nano-bar VGAA FETs are employed in the SRAM, the shorter-side width of the nano-bar of the transistors PD1 and PD2 is wider than that of the transistors PU1 and PU2 by, for example, about 20%, and/or the shorter-side width of the nano-bar of the transistors PG1 and PG2 is wider than that of the transistors PU1 and PU2 by, for example, about 20% wider.

The n-type VGAA includes a channel layer 110N, source/drain LDD (lightly doped drain) regions 115N, and a drain electrode (top plate) 40N. The n-type conductive region (active region 15N and/or silicide region 30N) functions as a source electrode. The channel layer 110N is surrounded by a gate dielectric layer 120N, which is further surrounded by a gate electrode 130N. The drain electrode 40N is connected to a first metal wiring 80N through a plate contact 50N and a first via 70N. A contact bar 60N is also provided to connect the n-type conductive region and a second via 75N that is further connected to a second metal wiring 85N.

Similarly, the p-type VGAA includes a channel layer 110P, source/drain LDD regions 115P, and a drain electrode (top plate) 40P. The p-type conductive region (active region 15P and/or silicide region 30P) functions as a source electrode. The channel layer 110P is surrounded by a gate dielectric layer 120P, which is further surrounded by a gate electrode 130P. The drain electrode 40P is connected to a first metal wiring 80P through a plate contact 50P and a first via 70P. A contact bar 60P is also provided to connect the p-type conductive region and a second via 75P that is further connected to a second metal wiring 85P.

The material for the gate electrode may be poly-Si, poly-Si with silicide, Al, Cu, W, Ti, Ta, TiN, TaN, TiW, WN, TiAl, TiAlN, TaC, TaCN and TiSiN, or any other suitable materials.

In certain embodiments, the gate dielectric layer includes one or more layers of a dielectric material, such as silicon oxide, silicon nitride, or high-k dielectric material, other suitable dielectric material, and/or combinations thereof. Examples of high-k dielectric material include HfO$_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

In some embodiments, one or more work function adjustment layers (not shown) are interposed between the gate dielectric layer and the gate electrode. The work function adjustment layers are made of a conductive material such as a single layer of TiN, TaN, TaAlC, TiC, TaC, Co, Al, TiAl, HfTi, TiSi, TaSi, NiSi, PtSi or TiAlC, or any other suitable materials, or a multilayer of two or more of these materials. For the n-channel Fin FET, one or more of TaN, TaAlC, TiN, TiC, Co, TiAl, HfTi, TiSi and TaSi, or any other suitable materials, is used as the work function adjustment layer, and for the p-channel Fin FET, one or more of TiAlC, Al, TiAl, TaN, TaAlC, TiN, TiC and Co, or any other suitable materials, is used as the work function adjustment layer. The work function adjustment layer may be formed separately for the n-channel Fin FET and the p-channel Fin FET, which may use different metal layers.

The source/drain of the n-type VGAA may include one or more dopants such as P, As, Sb, N or C, or any other suitable elements. The source/drain of the p-type VGAA may include one or more dopants such as B, In, N or C, or any other suitable elements.

The top plates are made of one or more layers of Si, Ti-based silicide, Co-based silicide, Ni-based silicide, Pt-based silicide, TiN, TaN, W, Cu, Al, or combinations thereof, or any other suitable materials. The plate contacts are made of one or more layers of Cu, W, Al, AlCu, TiN, TiW, Ti, Co, Ni, TaN, Ta, or any other suitable metals, or combinations thereof. The vias and metal layers are made of one or more layers of Cu, W, Al, AlCu, TiN, TiW, Ti, Co, Ni, TaN, Ta, or any other suitable metals, or combinations thereof.

Figure 3:
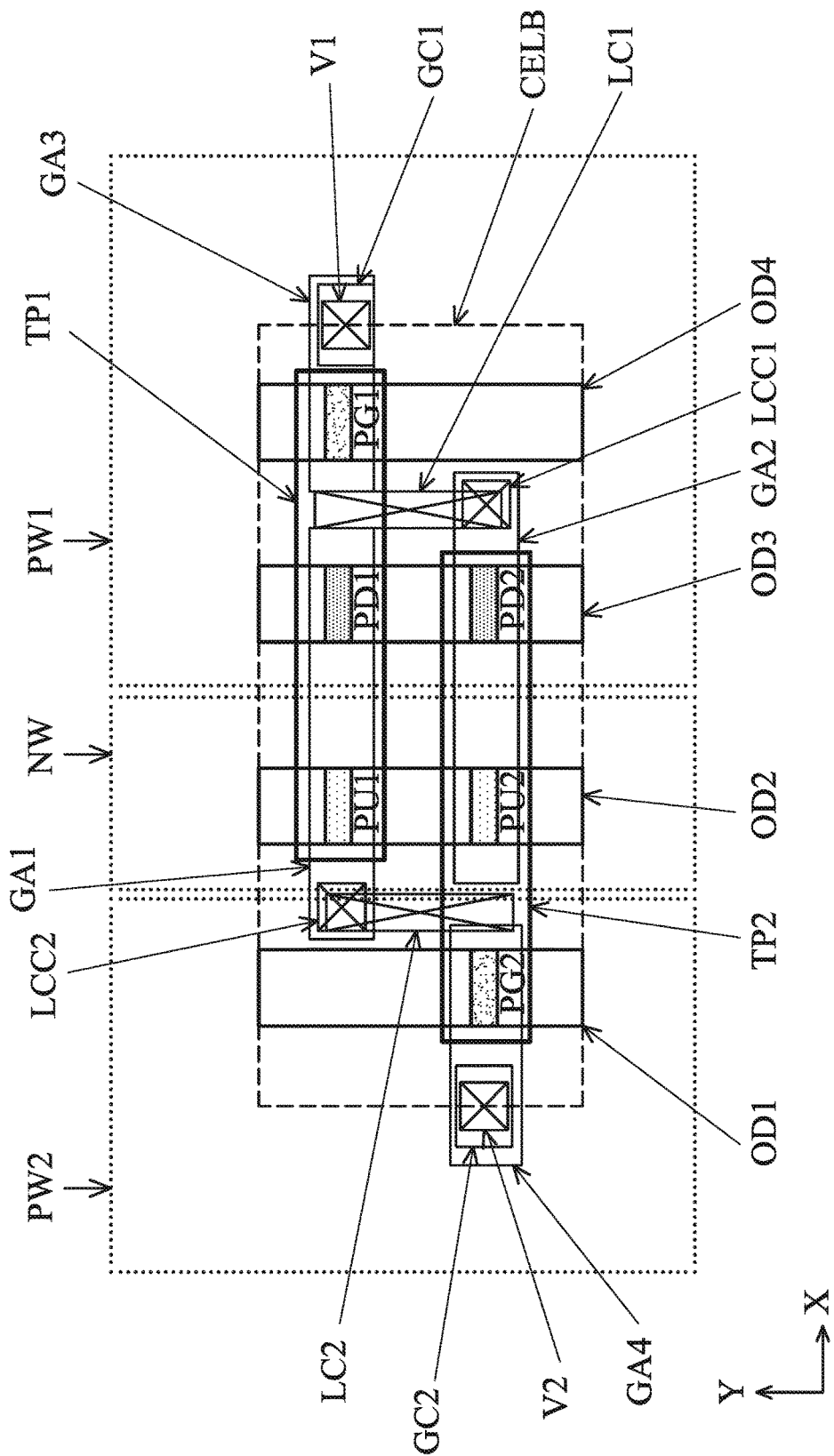
FIGS. 3 and 4 show an exemplary layout of SRAM unit cells according to one embodiment of the present disclosure.

FIG. 3 shows an exemplary layout structure of some of the element of one SRAM cell according to one embodiment of the present disclosure.

As shown in FIG. 3, the SRAM cell includes four conductive regions, a first conductive region OD1, a second conductive region OD2, a third conductive region OD3 and a fourth conductive region OD4, arranged in this order along the X direction. The conductive regions are separated from each other by an insulating layer such as a shallow trench isolation (STI).

The second conductive region OD2 is coupled to the sources of the first P-type device PU1 and the second P-type device PU2, and functions as a second power supply line, through which a second predetermined potential is supplied when the SRAM device is operating. The third conductive region OD3 is coupled to the sources of the first N-type device PD1 and the second N-type device PD2, and functions as a first power supply line, through which a first predetermined potential is supplied when the SRAM device is operating. The fourth conductive region OD4 is coupled to the source of the first pass-gate device PG1, and functions as a bit line. The first conductive region OD1 is coupled to the source of the second pass-gate device PG2, and functions as a complementary bit line. In this embodiment, the first predetermined potential is Vss, and the second predetermined potential is Vdd. When the first conductive type is an N-type and the second conductive type is a P-type, the first predetermined potential is Vdd and the second predetermined potential is Vss.

As shown in FIG. 3, the N-type well NW is located between the first P-type well PW1 and the second P-type well PW2 in the X direction (row direction). When a plurality of SRAM cells are arranged in a matrix, the first P-type well PW1 and the second P-type well PW2 are merged as a P-type well PW (see, FIG. 4).

In FIG. 3, the widths (along the X direction) of the conductive regions are equal to each other. However, the widths of the conductive regions may not necessarily be the same.

Still referring to FIG. 3, the SRAM cell includes four gate layers. A first gate layer GA1 is connected to a gate of the first P-type device PU1 and a gate of the first N-type device PD1. The first gate layer GA1 is the output DP1 of the first inverter INV1. A second gate layer GA2 is connected to a gate of the second P-type device PU2 and a gate of the second N-type device PD2. The second gate layer GA2 is the output DP2 of the second inverter INV2. A third gate layer GA3 is coupled to a gate of the first pass-gate device PG1 and to the word line WL (see, FIG. 1B) through a first gate contact GC1 disposed on the third gate layer GA3 and a first via V1 disposed on the first gate contact GC1. A fourth gate layer GA4 is coupled to a gate of the second pass-gate device PG2 and to the word line WL (see, FIG. 1B) through a second gate contact GC2 disposed on the fourth gate layer GA4 and a second via V2 disposed on the second gate contact GC2. As shown in FIG. 3, the first to fourth gate layers extend in the X direction.

Still referring to FIG. 3, the SRAM cell further includes a first top plate layer TP1 coupled to the drains of the first P-type device PU1, the first N-type device PD1 and the first pass-gate device PG1, and a second top plate layer TP2 coupled to the drains of the second P-type device PU2, the second N-type device PD2 and the second pass-gate device PG2. Each of the first top plate layer TP1 and the second top plate layer TP2 has a rectangular shape extending in the X direction in a plan (top) view.

The first and second top plate layers are made of one or more layers of Si, Ti-base silicide, Co-base silicide, Ni-base silicide, Pt-base silicide, TiN, TaN, W, Cu or Al, or any other suitable materials.

The SRAM cell further includes a first local connection structure electrically connecting the second gate layer GA2 and the first top plate layer TP1, and a second local connection structure electrically connecting the first gate layer GA1 and the second top plate layer TP2. The first local connection structure includes a first local connection contact LCC1 disposed on the second gate layer GA2 and a first local connection layer LC1 connecting the first local connection contact LCC1 and the first top plate layer TP1. The second local connection structure includes a second local connection contact LCC2 disposed on the first gate layer GA1 and a second local connection layer LC2 connecting the second local connection contact LCC2 and the second top plate layer TP2. The structures of the first and second local connection structures are not limited to the combination of LCC1 and LC1 or LCC2 and LC2. The structures of the first and second local connection structure may include a contact to the top plate layer or one or more conductive elements disposed in the layer(s) above the top plate.

Although the SRAM cell further includes other layers/elements, upper layer structures such as first metal wirings, second metal wirings disposed over the first metal wiring and second vias connecting the first metal wirings and the second metal wiring, the detailed structure thereof is omitted here.

Figure 4:
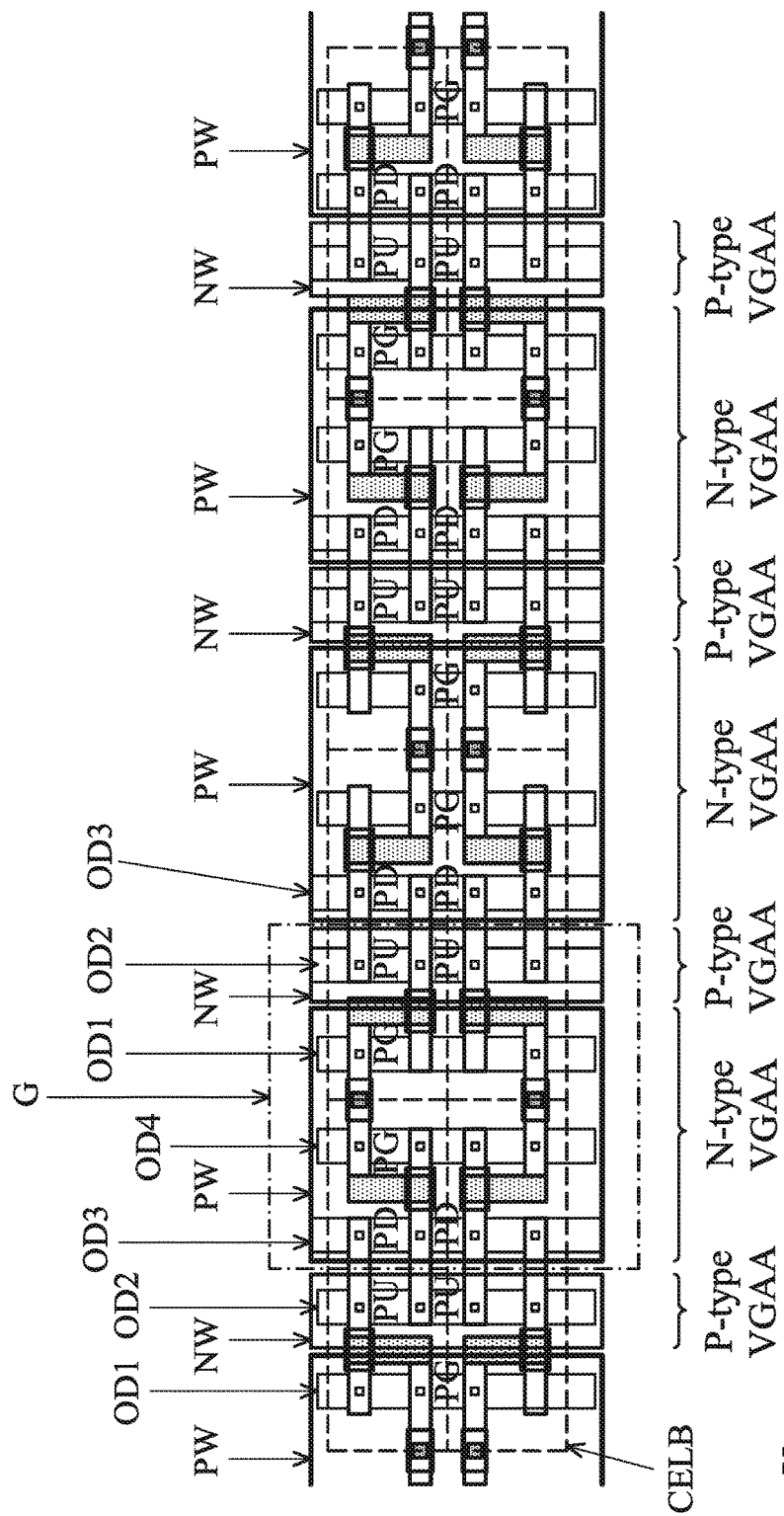

FIG. 4 shows an exemplary layout structure and configuration of eight SRAM cells in a 4-row and 2 column matrix. Similar to FIG. 1C, two types of SRAM cells, one of which corresponds to the SRAM cell of FIG. 3 and the other one of which corresponds to the flipped image of the SRAM cell of FIG. 3 with respect to a line parallel to the X direction, are arranged in a checker board pattern matrix.

When the plurality of SRAM cells are arranged in the X direction, three n-type conductive regions (e.g., OD1, OD3 and OD4) coupled to n-type VGAAs and one p-type conductive region (e.g., OD2) coupled to p-type VGAAs are alternately and repeatedly arranged. In other words, an SRAM array includes a plurality of groups of conductive regions, and each of the plurality of groups G of conductive regions includes a 1st conductive region (e.g., OD3), a 2nd conductive region (e.g., OD4), a 3rd conductive region (e.g., OD1) and a 4th conductive region (e.g., OD2) arranged in this order in the X (row) direction. The plurality of groups of conductive regions are arranged in the row direction such that the 4th conductive region (OD2) of one group of conductive regions is adjacent to the 1st conductive region (OD3) of adjacent one group of conductive regions. As shown in FIG. 4, n-wells NW and p-wells PW are alternately arranged in the X direction, each of the n-wells NW includes only one conductive region (OD2) and each of the p-wells PW includes only three conductive regions (OD1, OD3 and OD4).

It is noted that in FIG. 4, the group G is defined across the cell boundaries CELB of two adjacent SRAM cells.

In the layout structure of FIG. 4, since three first-type (e.g., n-type) conductive regions and one second-type (p-type) conductive regions are repeatedly arranged, more uniform patterning operations and/or film formation operations for the conductive regions are possible.

Figure 5:
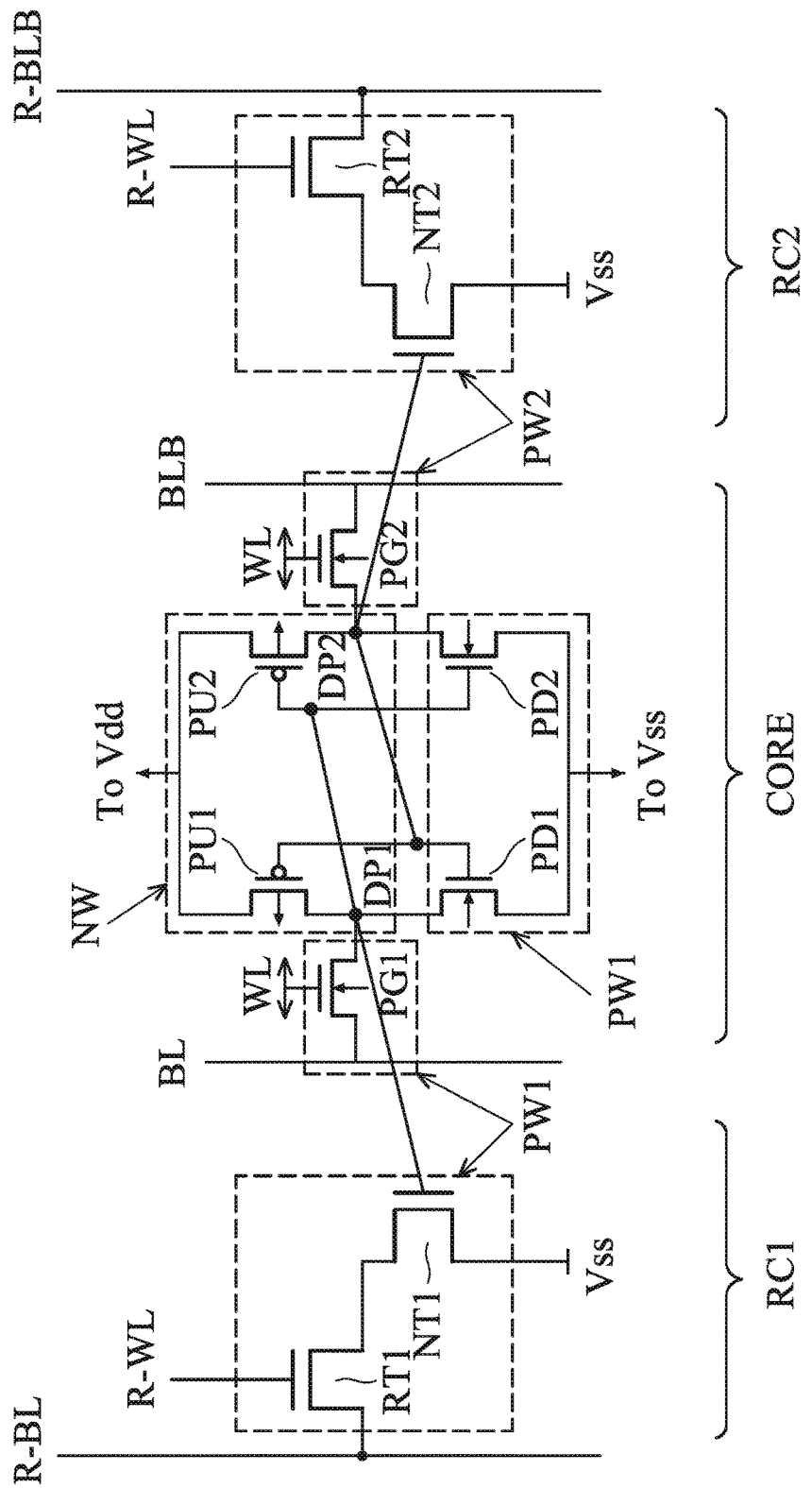
FIG. 5 is an exemplary circuit diagram of an SRAM unit cell according to another embodiment of the present disclosure.
Figure 6:
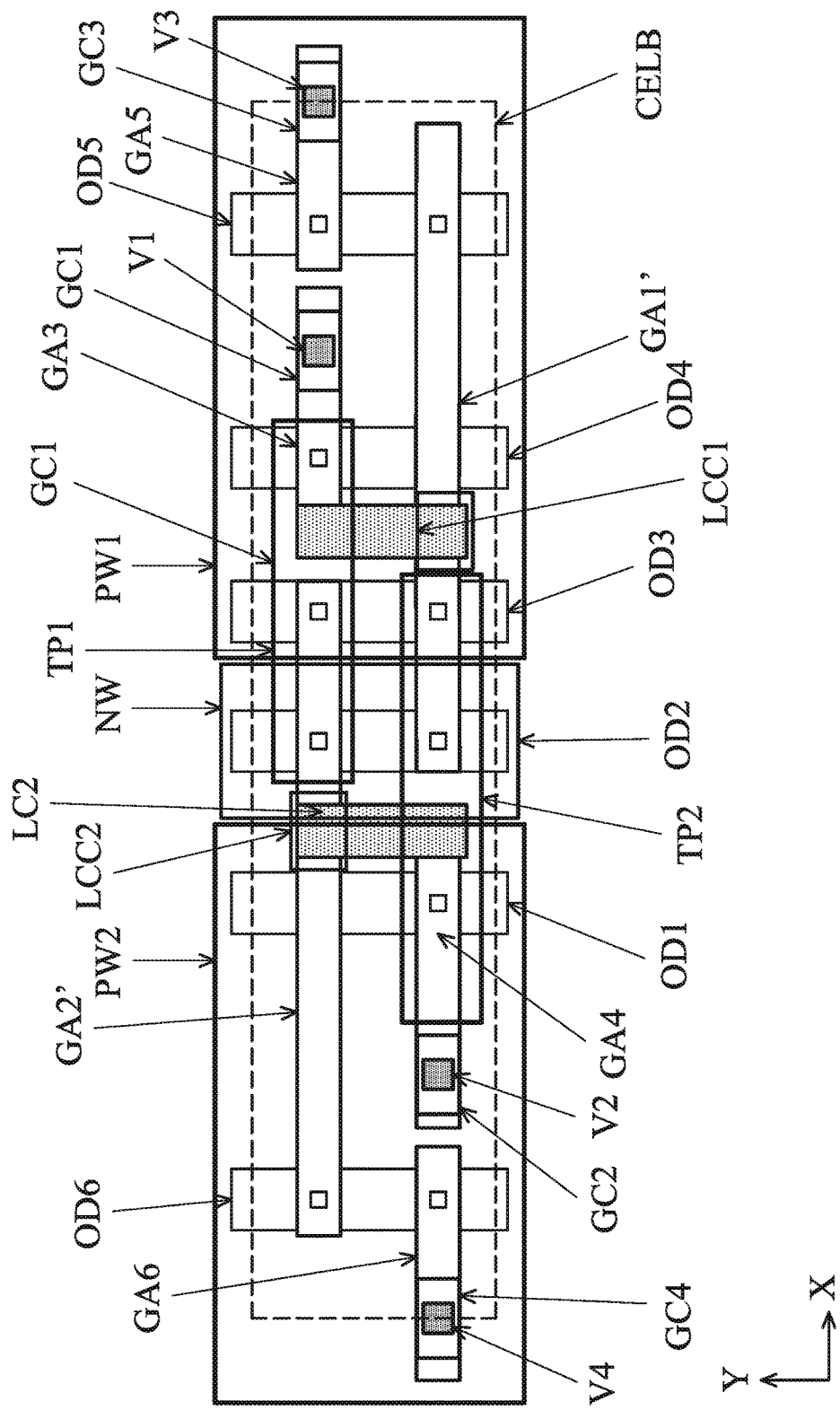
FIGS. 6 and 7 show an exemplary layout of SRAM unit cells according to another embodiment of the present disclosure.

FIG. 5 shows an exemplary circuit diagram of an SRAM cell and FIG. 6 is an exemplary layout structure of some of the elements of the SRAM cell according to another embodiment of the present disclosure.

In an SRAM cell of FIG. 5, the core portion CORE has the same configuration as the SRAM cell of FIG. 1B. In addition to the SRAM cell of FIG. 1B, two read circuits RC1 and RC2 are coupled to the data storage node DP1 and the complementary data storage node DP2, respectively.

The first read circuit RC1 includes a first read transistor RT1 and a first node transistor NT1 disposed in the first p-type well PW1 and the second read circuit RC2 includes a second read transistor RT2 and a second node transistor NT2 disposed in the second p-type well PW2. When a plurality of SRAM cells are arranged in a matrix, the first P-type well PW1 and the second P-type well PW2 are merged as a P-type well PW (see, FIG. 6).

In this embodiment, the first and second read transistors RT1, RT2 and the first and second node transistors NT1, NT2 are n-type VFET. The source of the first read transistor RT1 is coupled to the source of the first node transistor NT1 through a fifth conductive region OD5, and the source of the second read transistor RT2 is coupled to the source of the second node transistor NT2 through a sixth conductive region OD6, as shown in FIGS. 5 and 6.

The gates of the first and second read transistors RT1, RT2 are coupled to read-word line R-WL. The drain of the first read transistor RT1 is coupled to the read-bit line R-BL, and the drain of the second read transistor RT2 is coupled to the complementary read-bit line R-BLB. Further, the gate of the first node transistor NT1 is coupled to the data storage node DP1 and the gate of the second node transistor NT2 is coupled to the complementary data storage node DP2. The sources of the first and second node transistors NT1, NT2 are electrically coupled to the first power supply line, e.g., Vss.

As shown in FIG. 6, in one SRAM cell, six conductive regions, i.e., the sixth conductive region OD6, the first conductive region OD1, the second conductive region OD2, the third conductive region OD3, the fourth conductive region OD4 and the fifth conductive region OD5 are arranged in this order in the X direction, and ten VFETs are disposed within the cell boundary CELB.

The SRAM cell further includes six gate layers. A first gate layer GA1' is connected to a gate of the second P-type VFET PU2, a gate of the second N-type VFET PD2 and a gate of the first node VFET NT1. The first gate layer GA1' is the output DP2. A second gate layer GA2' is connected to a gate of the first P-type VFET PU1, a gate of the first N-type VFET PD1 and a gate of second node VFET NT2 (n-type). The second gate layer GA2' is the output DP1. A third gate layer GA3 is coupled to a gate of the first pass-gate device PG1 and to the word line WL (see, FIG. 5) through a first gate contact GC1 disposed on the third gate layer GA3 and a first via V1 disposed on the first gate contact GC1. A fourth gate layer GA4 is coupled to a gate of the second pass-gate device PG2 and to the word line WL (see, FIG. 5) through a second gate contact GC2 disposed on the fourth gate layer GA4 and a second via V2 disposed on the second gate contact GC2. A fifth gate layer GA5 is coupled to a gate of the first read VFET RT1 and coupled to the read-word line R-WL (see, FIG. 5) through a third gate contact GC3 disposed on the fifth gate layer GA5 and a third via V3 disposed on the third gate contact GC3. A sixth gate layer GA6 is coupled to a gate of the second read VFET RT2 and coupled to the read-word line R-WL (see, FIG. 5) through a fourth gate contact GC4 disposed on the sixth gate layer GA6 and a fourth via V4 disposed on the fourth gate contact GC4. As shown in FIG. 6, the first to sixth gate layers extend in the X direction.

Still referring to FIG. 6, the SRAM cell further includes a first top plate layer TP1 coupled to the drains of the first P-type device PU1, the first N-type device PD1 and the first pass-gate device PG1, and a second top plate layer TP2 coupled to the drains of the second P-type device PU2, the second N-type device PD2 and the second pass-gate device PG2. Each of the first top plate layer TP1 and the second top plate layer TP2 has a rectangular shape extending in the X direction in a plan (top) view.

The SRAM cell further includes a first local connection structure electrically connecting the first gate layer GA1' and the first top plate layer TP1, and a second local connection structure electrically connecting the second gate layer GA2' and the second top plate layer TP2. The first local connection structure includes a first local connection contact LCC1 disposed on the first gate layer GA1' and a first local connection layer LC1 connecting the first local connection contact LCC1 and the first top plate layer TP1. The second local connection structure includes a second local connection contact LCC2 disposed on the second gate layer GA2' and a second local connection layer LC2 connecting the second local connection contact LCC2 and the second top plate layer TP2. The structures of the first and second local connection structure are not limited to the combination of LCC1 and LC1 or LCC2 and LC2. The structures of the first and second local connection structure may include a contact to the top plate layer or one or more conductive elements disposed in the layer(s) above the top plate.

Although the SRAM cell further includes other layers/elements, upper layer structures such as first metal wirings, second metal wirings disposed over the first metal wiring and second vias connecting the first metal wirings and the second metal wiring, the detailed structure thereof is omitted here.

Figure 7:
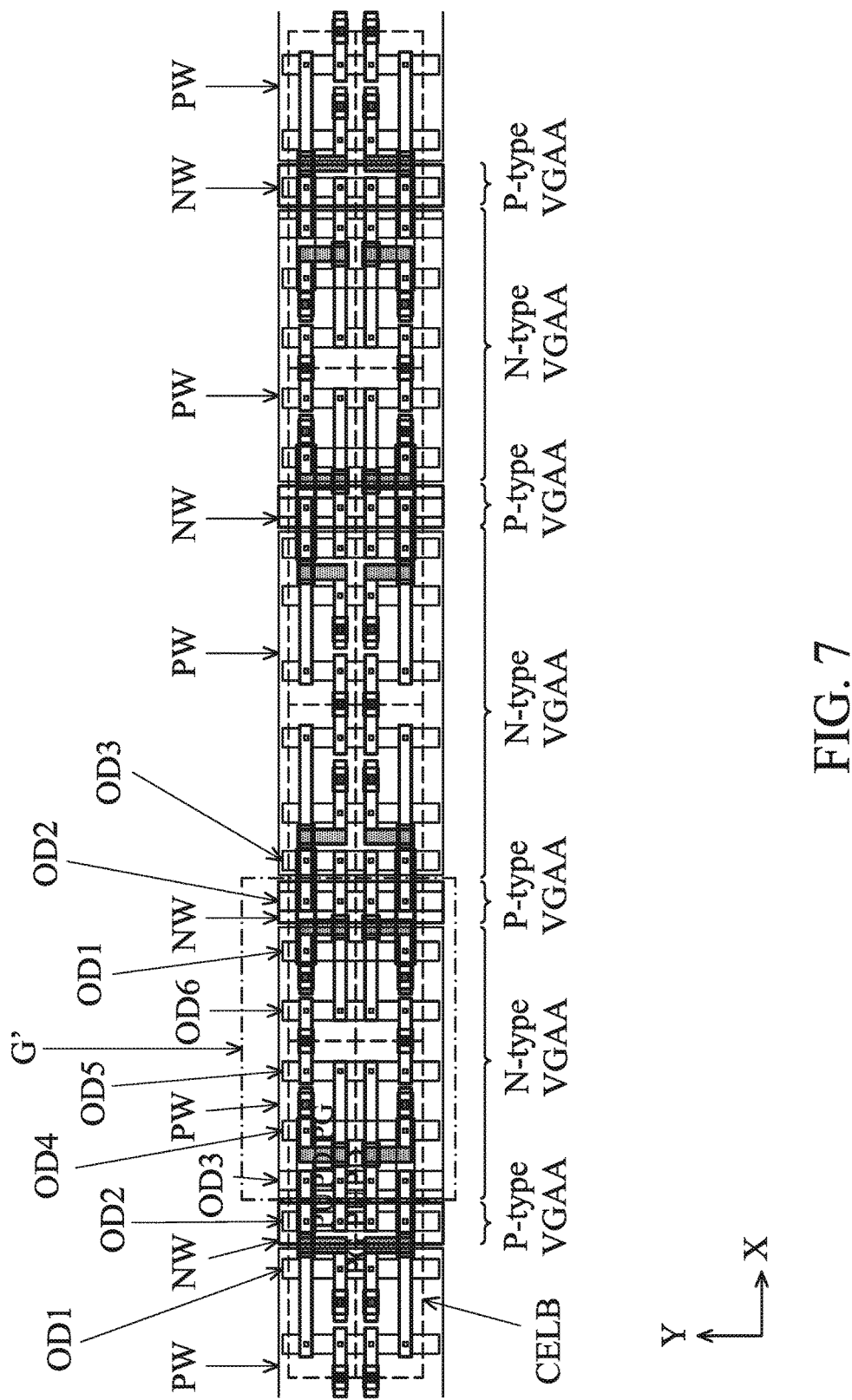

FIG. 7 shows an exemplary layout structure and configuration of eight SRAM cells in a 4-row and 2 column matrix. Similar to FIG. 1C, two types of SRAM cells, one of which corresponds to the SRAM cell of FIG. 6 and the other one of which corresponds to the flipped image of the SRAM cell of FIG. 6 with respect to the line parallel to the X direction, are arranged in a checker board pattern matrix.

When the plurality of SRAM cells are arranged in the X direction, five n-type conductive regions (e.g., OD1, OD3-OD6) coupled to n-type VGAAs and one p-type conductive region (e.g., OD2) coupled to p-type VGAAs are alternately and repeatedly arranged. In other words, an SRAM array includes a plurality of groups of conductive regions, and each of the plurality of groups G' of conductive regions includes a 1st conductive region (e.g., OD3), a 2nd conductive region (e.g., OD4), a 3rd conductive region (e.g., OD5), a 4th conductive region (e.g., OD6), a 5th conductive region (e.g., OD1) and a 6th conductive region (e.g., OD2) arranged in this order in the X (row) direction. The plurality of groups of conductive regions are arranged in the row direction such that the 6th conductive region (OD2) of one group of conductive regions is adjacent to the 1st conductive region (OD3) of adjacent one group of conductive regions. As shown in FIG. 7, n-wells NW and p-wells PW are alternately arranged in the X direction, each of the n-wells NW includes only one conductive region (OD2) and each of the p-wells PW includes only five conductive regions (OD1, OD3-OD6). It is noted that in FIG. 7, the group G is defined across the cell boundaries CELB of two adjacent SRAM cells.

In the layout structure of FIG. 7, since five first-type (e.g., n-type) conductive regions and one second-type (p-type) conductive regions are repeatedly arranged, more uniform patterning operations and/or film formation operations for the conductive regions are possible.

The various embodiments or examples described herein offer several advantages over the existing art. For example, in the present disclosure, since three or five first-type (e.g., n-type) conductive regions and one second-type (p-type) conductive regions are repeatedly arranged, more uniform patterning operations and/or film formation operations for the conductive regions are possible. Further, by using a VGAA FET device, an area of the SRAM unit cell can be reduced and more effectively control short channel effects, thereby realizing a lower power operation. It is also possible to more flexibly design the SRAM array.

It will be understood that not all advantages have been necessarily discussed herein, no particular advantage is required for all embodiments or examples, and other embodiments or examples may offer different advantages.

In accordance with one aspect of the present disclosure, an SRAM includes an SRAM array comprising a plurality of SRAM cells arranged in a matrix along a row direction and a column direction. Each of the SRAM cells includes six vertical field effect transistors (VFETs). The SRAM array includes a plurality of groups of conductive regions extending in the column direction. Each of the plurality of groups of conductive regions includes a first conductive region, a second conductive region, a third conductive region and a fourth conductive region arranged in this order in the row direction, the first to fourth conductive regions are separated by insulating regions from each other. The first, second and third conductive regions are coupled to sources of first conductive type VFETs, and the fourth conductive region is coupled to sources of second conductive type VFETs. The plurality of groups of conductive regions are arranged in the row direction such that the fourth conductive region of one group of conductive regions is adjacent to the first conductive region of adjacent one group of conductive regions In accordance with another aspect of the present disclosure, an SRAM includes an SRAM array comprising a plurality of SRAM cells arranged in a matrix along a row direction and a column direction. Each of the SRAM cells includes a plurality of VFETs. The plurality of SRAM cells includes a plurality of first SRAM cells and a plurality of second SRAM cells. A layout structure of each of the plurality of first SRAM cells is a flipped image of a layout structure of each of the plurality of second SRAM cells with respect to the row direction. The plurality of the first SRAM cells and the plurality of second SRAM cells are alternately arranged in the row direction and the column direction, thereby forming a checker board pattern matrix.

In accordance with another aspect of the present disclosure, an SRAM includes an SRAM array comprising a plurality of SRAM cells arranged in a matrix along a row direction and a column direction. Each of the SRAM cells includes ten VFETs. The SRAM array includes a plurality of groups of conductive regions extending in the column direction. Each of the plurality of groups of conductive regions includes a first conductive region, a second conductive region, a third conductive region, a fourth conductive region, a fifth conductive region and a sixth conductive region arranged in this order in the row direction, the first to sixth conductive regions being separated by insulating regions from each other. The first to the fifth conductive regions are coupled to sources of first conductive type VFETs, and the sixth conductive region is coupled to sources of second conductive type VFETs. The plurality of groups of conductive regions are arranged in the row direction such that the sixth conductive region of one group of conductive regions is adjacent to the first conductive region of adjacent one group of conductive regions.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A static random access memory (SRAM) device including an SRAM array comprising a plurality of SRAM cells arranged in a matrix along a row direction and a column direction, wherein:

each of the SRAM cells includes six vertical field effect transistors (VFETs), the SRAM array includes a plurality of groups of conductive regions extending in the column direction, each of the plurality of groups of conductive regions includes a first conductive region, a second conductive region, a third conductive region and a fourth conductive region arranged in this order in the row direction, the first to fourth conductive regions being separated by insulating regions from each other, the first, second and third conductive regions are coupled to sources of first conductive type VFETs, and the fourth conductive region is coupled to sources of second conductive type VFETs, and the plurality of groups of conductive regions are arranged in the row direction such that the fourth conductive region of one group of conductive regions is adjacent to the first conductive region of adjacent one group of conductive regions.

2. The SRAM device of claim 1, wherein the first conductive type VFETs are n-type VFETs and the second conductive type VFETs are p-type VFETs.

3. The SRAM device of claim 1, wherein:
the first conductive region functions as a first power supply line,
the second conductive region functions as a first bit line,
the third conductive region functions as a second bit lines complementary to the first bit line, and
the fourth conductive region functions as a second power supply line.

4. The SRAM device of claim 3, wherein:
the first power supply line supplies Vss when the SRAM device is operating, and
the second power supply line supplies Vdd when the SRAM device is operating.

5. The SRAM device of claim 1, wherein:
each of the plurality of SRAM cells comprises:
a first inverter and a second inverter;
a first pass-gate device coupled to an output of the first inverter and an input of the second inverter; and
a second pass-gate device coupled to an output of the second inverter and an input of the first inverter,
the first inverter includes a first VFET which is one of the first conductive type VFETs and a second VFET which is one of the second conductive type VFETs,
the second inverter includes a third VFET which is one of the first conductive type VFETs and a fourth VFET which is one of the second conductive type VFETs,
the first pass-gate device is a fifth VFET which is one of the first conductive type VFETs,
the second pass-gate device is a sixth VFET which is one of the first conductive type VFETs,
sources of the first VFET and the third VFET are coupled to the first conductive region,
a source of the fifth VFET is coupled to the second conductive region,
a source of the sixth VFET is coupled to the third conductive region, and
sources of the second VFET and the fourth VFET are coupled to the fourth conductive region.

6. The SRAM device of claim 5, wherein the first conductive type VFETs are n-type VFETs and the second conductive type VFETs are p-type VFETs.

7. The SRAM device of claim 5, wherein each of the plurality of SRAM cells further comprises:
a first gate layer connecting a gate of the first VFET and a gate of the second VFET, the first gate layer being the output of the first inverter;
a second gate layer connecting a gate of the third VFET and a gate of the fourth VFET, the second gate layer being the output of the second inverter;
a third gate layer coupled to a gate of the fifth VFET; and
a fourth gate layer coupled to a gate of the sixth VFET.

8. The SRAM device of claim 7, wherein each of the plurality of SRAM cells further comprises:
a first top plate layer coupled to drains of the first VFET, the second VFET and the fifth VFET; and
a second top plate layer coupled to drains of the third VFET, the fourth VFET and the sixth VFET,
wherein each of the first top plate layer and the second top plate layer each has a rectangular shape in a plan view.

9. The SRAM device of claim 8, wherein:
the first top plate is coupled to the second gate layer via a first local interconnect,
the second top plate is coupled to the first gate layer via a second local interconnect, and
the first and second local interconnects are formed in a layer below the first and second top plates and above the first and second gate layer.

10. The SRAM device of claim 2, wherein:
the first, second and third conductive regions are formed in a same p-type well, and
the fourth conductive region is formed in an n-type well.

11. A static random access memory (SRAM) device including an SRAM array comprising a plurality of SRAM cells arranged in a matrix along a row direction and a column direction, wherein:
the SRAM cells includes a first SRAM cell and a second SRAM cell arranged adjacent to the first SRAM cell in the row direction,
each of the first and second SRAM cells includes six vertical field effect transistors (VFETs), and includes a first conductive region, a second conductive region, a third conductive region and a fourth conductive region, the first to fourth conductive regions being separated by insulating regions from each other,
the third conductive region, the forth conductive region, the first conductive region and the second conducive region are arranged in this order in the row direction,
the first, second and third conductive regions are coupled to sources of first conductive type VFETs, and the fourth conductive region is coupled to sources of second conductive type VFETs, and
the second conductive region of the first SRAM cell is adjacent to the third conductive region of the second SRAM cell.

12. The SRAM device of claim 11, wherein the first conductive type VFETs are n-type VFETs and the second conductive type VFETs are p-type VFETs.

13. The SRAM device of claim 11, wherein:
the first conductive region functions as a first power supply line,
the second conductive region functions as a first bit line,
the third conductive region functions as a second bit lines complementary to the first bit line, and
the fourth conductive region functions as a second power supply line.

14. The SRAM device of claim 13, wherein:
the first power supply line supplies Vss when the SRAM device is operating, and
the second power supply line supplies Vdd when the SRAM device is operating.

15. The SRAM device of claim 12, wherein:
each of the first and second SRAM cells comprises:
a first inverter and a second inverter;
a first pass-gate device coupled to an output of the first inverter and an input of the second inverter; and
a second pass-gate device coupled to an output of the second inverter and an input of the first inverter,
the first inverter includes a first VFET which is one of the first conductive type VFETs and a second VFET which is one of the second conductive type VFETs,
the second inverter includes a third VFET which is one of the first conductive type VFETs and a fourth VFET which is one of the second conductive type VFETs,
the first pass-gate device is a fifth VFET which is one of the first conductive type VFETs, the second pass-gate device is a sixth VFET which is one of the first conductive type VFETs,
sources of the first VFET and the third VFET are coupled to the first conductive region,
a source of the fifth VFET is coupled to the second conductive region,
a source of the sixth VFET is coupled to the third conductive region, and
sources of the second VFET and the fourth VFET are coupled to the fourth conductive region.

16. The SRAM device of claim 15, wherein each of the first and second SRAM cells further comprises:
a first gate layer connecting a gate of the first VFET and a gate of the second VFET, the first gate layer being the output of the first inverter;
a second gate layer connecting a gate of the third VFET and a gate of the fourth VFET, the second gate layer being the output of the second inverter;
a third gate layer coupled to a gate of the fifth VFET; and
a fourth gate layer coupled to a gate of the sixth VFET.

17. The SRAM device of claim 16, wherein each of the first and second SRAM cells further comprises:
a first top plate layer coupled to drains of the first VFET, the second VFET and the fifth VFET; and
a second top plate layer coupled to drains of the third VFET, the fourth VFET and the sixth VFET,
wherein each of the first top plate layer and the second top plate layer each has a rectangular shape in a plan view.

18. The SRAM device of claim 17, wherein:
the first top plate is coupled to the second gate layer via a first local interconnect,
the second top plate is coupled to the first gate layer via a second local interconnect, and
the first and second local interconnects are formed in a layer below the first and second top plates and above the first and second gate layer.

19. The SRAM device of claim 11, wherein plural first SRAM cells and plural second SRAM cells are arranged alternately along the row direction.

20. A static random access memory (SRAM) device including an SRAM array comprising a plurality of SRAM cells arranged in a matrix along a row direction and a column direction, wherein:
the plurality of SRAM cells includes first SRAM cells and second SRAM cells arranged alternately in the row direction and the column direction so as to form a the matrix,
each of the first and second SRAM cells includes six vertical field effect transistors (VFETs), and includes a first conductive region, a second conductive region, a third conductive region and a fourth conductive region, the first to fourth conductive regions being separated by insulating regions from each other,
the third conductive region, the forth conductive region, the first conductive region and the second conducive region are arranged in this order in the row direction,
the first, second and third conductive regions are coupled to sources of first conductive type VFETs, and the fourth conductive region is coupled to sources of second conductive type VFETs, and
the second conductive region of one of the first SRAM cells is adjacent to the third conductive region of one of the second SRAM cells adjacent to the one of the first SRAM cells in the row direction.

* * * * *